Feb. 18, 1964 W. F. PALMER 3,121,802

MULTIVIBRATOR CIRCUIT EMPLOYING TRANSISTORS OF COMPLEMENTARY TYPES

Filed Jan. 23, 1959

INVENTOR.
WILLIAM F. PALMER

BY Elmer J. Nealon

ATTORNEY.

United States Patent Office 3,121,802

Patented Feb. 18, 1964

3,121,802

MULTIVIBRATOR CIRCUIT EMPLOYING TRANSISTORS OF COMPLEMENTARY TYPES

William F. Palmer, Carlisle, Mass., assignor, by mesne assignments, to Sylvania Electric Products Inc., Wilmington, Del., a corporation of Delaware Filed Jan. 23, 1959, Ser. No. 788,661
7 Claims. (Cl. 307—88.5)

The present invention relates to transistor multivibrator circuits, and more particularly to multivibrator circuits having a pair of transistors of complementary type.

Multivibrators of known types whether bistable, monostable, or astable generally employ two tubes or transistors with the output of each connected to the input of the other so that while one of the tubes or transistors is in the high conduction condition the other is in the low conduction condition. The circuit is generally considered to be in the "off" state when an arbitrarily selected transistor or tube is in the low conduction condition and the other transistor or tube is in the high conduction condition. With the conduction conditions reversed, the circuit is considered to be in the "on" state. The useful output power that may be taken from such a multivibrator circuit is limited by the power handling capacity of each of the transistors or tubes when each is in the high conduction condition. Power consumption by the circuit is generally considerable in both the "off" and "on" states, and frequently no use is made of the power consumed in the "off" state. These characteristics of the typical multivibrator circuit may be a decided disadvantage in applications wherein a large amount of power is desired only occasionally for short periods while the circuit is "on," and wherein low power drain is desired during long standby periods while the circuit is "off."

It is an object of the invention, therefore, to provide an improved transistor multivibrator circuit.

It is a more specific object of the invention to provide an improved transistor multivibrator circuit having large power output capabilities in the "on" state and low power drain in the "off' state.

Briefly, in accordance with the objects of the invention a pair of transistors of complementary type are provided with each having its collector connected to the base of the other transistor. Means are provided for connecting a source of direct-current potential to the transistors to bias the emitter-to-base junction of each transistor in the forward direction and the collector-to-base junction of each transistor in the reverse direction.

Multivibrator circuits according to the invention are characterized in that both transistors are in the high conduction or in the low conduction condition at the same time, and not alternately. The existence of these conditions may be considered to constitute the "on" and "off" states, respectively, of the circuit.

Figure 1:
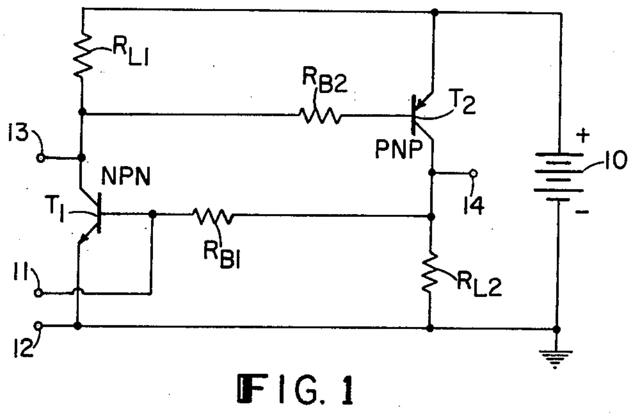
Figure 2:
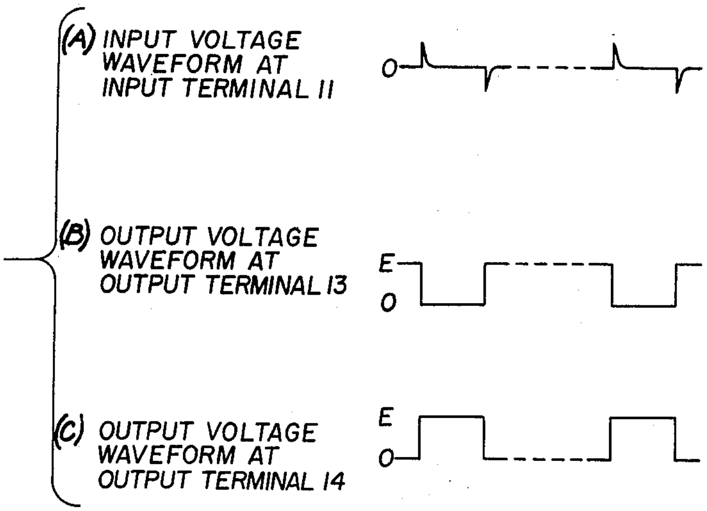

Other objects, features, and advantages of multivibrator circuits according to the invention will be apparent from the following discussion and the accompanying drawing wherein:

FIG. 1 is a schematic diagram of a bistable transistor multivibrator circuit according to the invention, and FIG. 2 is a set of graphs showing input and output voltage waveforms for the circuit of FIG. 1.

In FIG. 1 of the drawing is shown a pair of complementary transistors; and NPN transistor $T_1$ having an emitter, collector, and base, and a PNP transistor $T_2$ having an emitter, collector, and base. A direct-current potential source shown as a battery 10 has its positive terminal connected directly to the emitter of the PNP transistor $T_2$, and its negative terminal, which is grounded, connected directly to the emitter of the NPN transistor $T_1$. The positive terminal of the battery is also connected through a first load resistance $R_{L1}$ to the collector of the PNP transistor $T_1$, and the negative terminal is also connected through a second load resistance $R_{L2}$ to the collector of the PNP transistor $T_2$. The base of the NPN transistor $T_1$ is connected to the collector of the PNP transistor $T_2$ through a base resistance $R_{B1}$, and the base of the PNP transistor $T_2$ is connected to the collector of the NPN transistor $T_1$ through another base resistance $R_{B2}$. Input signals for switching the multivibrator from one state to the other are applied across input terminal 11 and ground terminal 12 for application to the base of the NPN transistor $T_1$. Output signals may be taken from the circuit at output terminals 13 and 14 connected at the collector of the NPN transistor $T_1$ and the PNP transistor $T_2$, respectively.

Operation of the bistable multivibrator circuit of FIG. 1 may best be described in conjunction with the graphs of voltage waveforms shown in FIG. 2. Assuming the multivibrator to be in the "off" state, both transistors are in the low conduction or "off" condition. The potential at the first output terminal 13 is approximately E as shown in graph B of FIG. 2, the same as the potential of the battery 10, and the second output terminal 14 is approximately at ground potential. The base of each of the transistors is at approximately the same potential as its respective emitter and both transistors thus remain in the low conduction or "off" condition.

When a positive pulse as shown in graph A of FIG. 2 is applied to the input terminal 11, the base of the NPN transistor $T_1$ becomes positive with respect to its emitter and the transistor is triggered to the "on" or high conduction condition. The resulting voltage drop across the first load resistor $R_{L1}$ lowers the potential on the NPN transistor collector as shown in graph B of FIG. 2. This action lowers the potential on the base of the PNP transistor $T_2$, thus triggering that transistor to the "on" or high conduction condition. Resultant collector current flow through the load resistance $R_{L2}$ raises the potential on the collector of the PNP transistor to E as shown in graph C of FIG. 2. This action provides a positive bias on the base of the NPN transistor $T_1$ which continues after the positive input pulse ceases. The multivibrator circuit is thus switched to the "on" state by a momentary pulse switching one of the transistors "on." The circuit is maintained in this state by regenerative feedback from the collector of each transistor to the base of the other.

The multivibrator may be triggered from the "on" state to the "off" state by a negative pulse as shown in graph A of FIG. 2 applied to the the input terminal 11. A negative pulse at the base of the NPN transistor $T_1$ drives that transistor toward the low conduction condition. As the collector current decreases, the potential on the collector rises toward E as shown in graph B of FIG. 2. The potential at the base of the PNP transistor $T_2$ also rises, thus driving that transistor toward the low conduction condition. With reduced collector current flowing through the load resistance $R_{L2}$, the potential on the collector of the PNP transistor $T_2$ drops as shown in graph C of FIG. 2. In turn, the potential applied to the base of the NPN transistor $T_1$ also drops tending to turn that transistor "off." This action is cumulative. Thus the multivibrator circuit is switched to the "off" state by a momentary pulse tending to turn one of the transistors "off." The circuit is maintained in this state by regenerative feedback from the collector of each transistor to the base of the other.

In one typical example of a bistable multivibrator circuit as shown in the drawing, a Sylvania type 2N35 junction transistor is the NPN transistor $T_1$ and a Sylvania type 2N34 junction transistor is the PNP transistor $T_2$. The load resistances $R_{L1}$ and $R_{L2}$ are each 470 ohms, and the base resistances $R_{B1}$ and $R_{B2}$ are each 4,700 ohms.

The battery 10 is of 12 volt potential. This example of the circuit may be triggered either "on" or "off" by input pulses of approximately one-half volt.

Although only a single embodiment of a bistable multivibrator circuit has been shown and described, various modifications coming within the scope of the invention are obviously possible. For example, various input or driving circuits may be employed in conjunction with the proper input signals depending on the purpose for which the circuit is to be used. The switching actions obtainable may be stated generally as follows: when the circuit is in the "off" state, a positive pulse at the base of the NPN transistor or at the collector of the PNP transistor, or a negative pulse at the base of the PNP transistor or at the collector of the NPN transistor will turn the circuit "on." When the circuit is in the "on" state, pulses of the opposite polarity at the above-named electrodes will turn the circuit "off." Various forms of "steering circuits" for properly applying input pulses to the proper electrodes in order to obtain the desired switching actions are well known. A suitable steering circuit may be chosen depending upon the input signals being received and the purpose for which the multivibrator is intended.

It is possible to utilize the output of the circuit in various ways. Waveforms of the output voltages available directly at the collectors of the transistors are shown in graphs B and C of FIG. 2. These signals may be used singly, separately, or together. Relay windings may serve as the load impedance. In this situation the effect of the currents may be added to operate heavier relays than would be possible with a conventional transistor multivibrator. It is also possible to reduce the resistance of the load resistors and place a circuit load in series with either the positive or negative terminal of the battery and the remainder of the circuit.

Modification of the circuit shown and described by changing the resistances of the circuit shown to complex impedances is also feasible. Monostable and astable multivibrator circuits can be made by applying suitable biases and changing the base impedances to include capacitance.

What is claimed is:

1. A multivibrator comprising a PNP transistor and an NPN transistor each having emitter, base and collector; the multivibrator being in a first operating state when both of said transistors are in the low conduction condition and being in a second operating state when both of said transistors are in the high conduction condition; a source of substantially constant direct-current potential; conductive means connecting the emitter of the PNP transistor directly to the positive terminal of said source; resistance means connecting the collector of the NPN transistor to the positive terminal of said source; conductive means connecting the emitter of the NPN transistor directly to the negative terminal of said source; resistance means connecting the collector of the PNP transistor to the negative terminal of said source; means connecting the base of each transistor to the collector of the other; means for altering the bias on the base of at least one of the transistors to increase conduction through the transistor and trigger the multivibrator from the first operating state to the second operating state; means for altering the bias on the base of at least one of the transistors to decrease conduction through the transistor and trigger the multivibrator from the second operating state to the first operating state; and means for deriving an output signal from the collector of at least one of the transistors.

2. A multivibrator circuit having two stable operating states including in combination a PNP transistor and an NPN transistor each having emitter, base, and collector; the circuit being in the first of said two stable operating states when both of said transistors are in the low conduction condition and being in the second of said states when both of said transistors are in the high conduction condition; a source of substantially constant direct-current potential having its positive terminal connected directly to the emitter of the PNP transistor and its negative terminal connected directly to the emitter of the NPN transistor; a first resistance connecting the negative terminal of said source to the collector of said PNP transistor; a second resistance connecting the positive terminal of said source to the collector of said NPN transistor; a third resistance connecting the base of said PNP transistor to the collector of said NPN transistor; a fourth resistance connecting the collector of said PNP transistor to the base of said NPN transistor; input means for applying a momentary input signal to the base of at least one of said transistors to increase conduction through the transistor and trigger the multivibrator circuit from the first stable operating state to the second stable operating state; and input means for applying a momentary input signal to the base of at least one of said transistors to decrease conduction through the transistor and trigger the multivibrator circuit from the second stable operating state to the first stable operating state.

3. A multivibrator comprising a PNP transistor and an NPN transistor each having emitter, base and collector; the multivibrator being in a first operating state when both of said transistors are in the low conduction condition and being in a second operating state when both of said transistors are in the high conduction condition; a source of substantially constant direct-current potential; means connecting the emitter of the PNP transistor directly to the positive terminal of said source; means connecting the collector of the NPN transistor to the positive terminal of said source; means connecting the emitter of the NPN transistor directly to the negative terminal of said source; means connecting the collector of the PNP transistor to the negative terminal of said source; regenerative feedback means connecting the collector of each transistor to the base of the other; means for altering the bias on the base of at least one of the transistors to increase conduction through the transistor whereby regenerative feedback from the collector of each transistor to the base of the other through said regenerative feedback means changes both transistors from the low conduction condition to the high conduction condition; and means for altering the bias on the base of at least one of the transistors to decrease conduction through the transistor whereby regenerative feedback from the collector of each transistor to the base of the other through said regenerative feedback means changes both transistors from the high conduction condition to the low conduction condition.

4. A multivibrator circuit having two stable operating states including in combination a PNP transistor and an NPN transistor each having emitter, base, and collector; the circuit being in the first of said two stable operating states when both of said transistors are in the low conduction condition and being in the second of said states when both of said transistors are in the high conduction condition; a source of substantially constant direct-current potential having its positive terminal connected directly to the emitter of the PNP transistor and its negative terminal connected directly to the emitter of the NPN transistor; a first resistance connecting the negative terminal of said source to the collector of said PNP transistor; a second resistance connecting the positive terminal of said source to the collector of said NPN transistor; regenerative feedback means connecting the collector of each transistor to the base of the other; input means for applying a momentary pulse to the base of one of said transistors tending to increase conduction through the transistor whereby regenerative feedback from the collector of each transistor to the base of the other through said regenerative feedback means changes both transistors from the low conduction condition to the high conduction condition and maintains the transistors in the high conduction condition after cessation of the momentary pulse; and input means for applying a momentary pulse to the base of one of said transistors tending to decrease conduction through the transistor whereby regenerative feedback from the collector of each transistor to the base of the other through said regenerative feedback means changes both transistors from the high conduction condition to the low conduction condition and maintains the transistors in the low conduction condition after cessation of the momentary pulse.

5. A multivibrator circuit having two stable operating states including in combination a PNP transistor and an NPN transistor each having emitter, base, and collector; the circuit being in the first of said two stable operating states when both of said transistors are in the low conduction condition and being in the second of said states when both of said transistors are in the high conduction condition; a source of substantially constant direct-current potential having its positive terminal connected directly to the emitter of the PNP transistor and its negative terminal connected directly to the emitter of the NPN transistor; a first resistance connecting the negative terminal of said source to the collector of said PNP transistor; a second resistance connecting the positive terminal of said source to the collector of said NPN transistor; a third resistance connecting the base of said PNP transistor to the collector of said NPN transistor; a fourth resistance connecting the collector of said PNP transistor to the base of said NPN transistor; input means for applying a momentary pulse to the base of one of said transistors tending to drive that transistor from the low conduction condition to the high conduction condition, regenerative feedback from the collector of each transistor to the base of the other through said third and fourth resistances causing both of said transistors to change from the low conduction condition to the high conduction condition and maintaining said transistors in the high conduction condition after cessation of the momentary pulse; input means for applying a momentary pulse to the base of one of said transistors tending to drive that transistor from the high conduction condition to the low conduction condition, regenerative feedback from the collector of each transistor to the base of the other through said third and fourth resistances causing both of said transistors to change from the high conduction condition to the low conduction condition and maintaining said transistors in the low conduction condition after cessation of the momentary pulse; and means for deriving output signals from the collector of at least one of said transistors.

6. A multivibrator comprising a PNP transistor and an NPN transistor each having emitter, base, and collector; the multivibrator being in a first operating state when both of said transistors are in the low conduction condition and being in a second operating state when both of said transistors are in the high conduction condition; a source of substantially constant direct-current potential; circuit means connecting the positive terminal of said source to the emitter of the PNP transistor and to the collector of the NPN transistor; circuit means connecting the negative terminal of said source to the emitter of the NPN transistor and to the collector of the PNP transistor; regenerative feedback means connecting the collector of each transistor to the base of the other; means for altering the bias on the base of at least one of the transistors to increase conduction through the transistor whereby regenerative feedback from the collector of each transistor to the base of the other through said regenerative feedback means changes both transistors from the low conduction condition to the high conduction condition; and means for altering the bias on the base of at least one of the transistors to decrease conduction through the transistor whereby regenerative feedback from the collector of each transistor to the base of the other through said regenerative feedback means changes both transistors from the high conduction condition to the low conduction condition.

7. A multivibrator circuit having two stable operating states including in combination a PNP transistor and an NPN transistor each having emitter, base, and collector; the circuit being in the first of said two stable operating states when both of said transistors are in the low conduction condition and being in the second of said states when both of said transistors are in the high conduction condition; a source of substantially constant direct-current potential; circuit means connecting the positive terminal of said source to the emitter of the PNP transistor and to the collector of the NPN transistor; circuit means connecting the negative terminal of said source to the emitter of the NPN transistor and to the collector of the PNP transistor; regenerative feedback means connecting the collector of each transistor to the base of the other; input means for applying a momentary pulse to the base of one of said transistors tending to drive that transistor from the low conduction condition to the high conduction condition whereby regenerative feedback from the collector of each transistor to the base of the other through said regenerative feedback means changes both transistors from the low conduction condition to the high conduction condition and maintains the transistors in the high conduction condition after cessation of the momentary pulse; and input means for applying a momentary pulse to the base of one of said transistors tending to drive that transistor from the high conduction condition to the low conduction condition whereby regenerative feedback from the collector of each transistor to the base of the other through said regenerative feedback means changes both transistors from the high conduction condition to the low conduction condition and maintains the transistors in the low conduction condition after cessation of the momentary pulse.

References Cited in the file of this patent

UNITED STATES PATENTS

| | | |
|---|---|---|
| 2,655,609 | Shockley | Oct. 13, 1953 |
| 2,769,907 | Lohman | Nov. 6, 1956 |
| 2,802,067 | Zawels | Aug. 6, 1957 |
| 2,829,257 | Root | Apr. 1, 1958 |
| 2,831,113 | Weller | Apr. 15, 1958 |
| 2,919,355 | Huang | Dec. 29, 1959 |